United States Patent
Vincent et al.

(10) Patent No.: US 7,943,887 B2
(45) Date of Patent: May 17, 2011

(54) INDEXING METHOD AND APPARATUS FOR AN ELECTROHEATING TECHNOLOGY OVEN

(75) Inventors: Christopher Vincent, Hughesville, PA (US); Drew Knopfel, Williamsport, PA (US); Richard Heckert, Lewisburg, PA (US)

(73) Assignee: Lunare Limited (A PA Corp.), Williamsport, PA (US)

( * ) Notice: Subject to any disclaimer, the term of this patent is extended or adjusted under 35 U.S.C. 154(b) by 1005 days.

(21) Appl. No.: 11/812,236

(22) Filed: Jun. 15, 2007

(65) Prior Publication Data

US 2008/0308546 A1    Dec. 18, 2008

(51) Int. Cl.
*F27B 5/12* (2006.01)
*B65H 1/00* (2006.01)

(52) U.S. Cl. ........ 219/394; 219/395; 219/388; 219/410; 414/222.09

(58) Field of Classification Search ......................... None
See application file for complete search history.

(56) References Cited

U.S. PATENT DOCUMENTS

| | | | | |
|---|---|---|---|---|
| 2,372,362 A | * | 3/1945 | Dawson | 126/41 A |
| 2,447,641 A | * | 8/1948 | Dunham | 99/386 |
| 3,552,299 A | * | 1/1971 | Patoka | 99/339 |
| 4,132,216 A | * | 1/1979 | Guibert | 126/261 |
| 4,307,286 A | * | 12/1981 | Guibert | 219/400 |
| 4,350,873 A | * | 9/1982 | Willett | 219/388 |
| 4,625,867 A | * | 12/1986 | Guibert | 126/21 A |
| 6,069,342 A | * | 5/2000 | Amador et al. | 219/388 |
| 2005/0186114 A1 | * | 8/2005 | Reinhardt et al. | 422/65 |

* cited by examiner

*Primary Examiner* — Joseph M Pelham
(74) *Attorney, Agent, or Firm* — Baker & Hostetler LLP

(57) ABSTRACT

An oven includes: an inlet elevator having multiple receiving bays for receiving a piece to be heated in the oven where the receiving bays are stacked vertically and the elevator is configured to move up or down to align a receiving bay; a mandrel having multiple shelves to correspond a shelf to a bay of the inlet elevator, each shelf configured to support a piece received from the inlet elevator, the mandrel configured to rotate each piece on a shelf between a loading position, a baking position, and an unloading position; an outlet elevator having multiple receiving bays for unloading a piece heated in the oven, the unloading bays are stacked vertically and the elevator is configured to move up or down to align an unloading bay with a material handling system moving the heated pieces; and a microwave generator configured to heat at least one of the pieces when the pieces are in the baking position. A method of heating a material is also provided.

12 Claims, 2 Drawing Sheets

INDEXING METHOD AND APPARATUS FOR AN ELECTROHEATING TECHNOLOGY OVEN

FIELD OF THE INVENTION

The present invention relates generally to ovens for curing products such as microchips. More particularly, the present invention relates to an oven for curing products received in a substantially continuous feed system where the oven heats using electroheating technologies (i.e. microwaves and ebeam)

BACKGROUND OF THE INVENTION

There are several industrial uses for ovens. For example, in the semi-conductor industry, part of the manufacturing process for microchips includes curing the microchip in an oven. Like many industries, microchip manufacturing relies on manufacturing a large amount of individual parts. It is desirable to look for methods and mechanisms that can handle vast amounts of parts at one time and reduce the amount of floor space needed to perform a particular function in the manufacturing process.

In many manufacturing processes, the product is moved throughout a system in an assembly line-type manner. A material handling system moves the product along the manufacturing process. The material handling system may be a conveyor system, for example.

When a product is being moved in a conveyor-type system, it is desirable to keep the product moving rather than stopping the product in a particular location in the line in order for an operation to be performed on the product. Stopping products at a particular point in the line can have an effect of backing up the assembly line upstream to the stopped portion and creating a gap in the downstream delivery of product. Thus, it is desirable to, as much as possible, keep products moving along the assembly line.

When, for various reasons, products need to be stopped, it is, of course, desirable to keep the operation causing the product to be stopped to be accomplished quickly so that the product can continue to move throughout along the assembly line system. A metric used to measure a through-put capacity of a particular apparatus used in a manufacturing process is referred to as units-per-hour or "UPH". In general, it is desirable for an apparatus to have relatively high UPH, and, thus, there is always a need in the industry to generate products that have an ever-higher UPH. At the same time, in order to reduce floor space and thus cost in a process, it is desirable to reduce the footprint of an apparatus in the manufacturing process. Accordingly, it is desirable to provide a method and apparatus that can offer a greater UPH for processing products and/or also a reduced footprint from previous ovens.

SUMMARY OF THE INVENTION

The foregoing needs are met, to a great extent, by the present invention, wherein in one aspect an apparatus is provided that some embodiments of the invention provide an increased UPH for processing products and/or a reduced footprint in comparison to prior art ovens.

In accordance with one embodiment of the present invention an oven is provided. In some embodiments of the invention, the oven includes: an inlet elevator having multiple receiving bays for receiving a piece to be heated in the oven, where the receiving bays are stacked vertically and the elevator is configured to move up or down to align a receiving bay; a mandrel having multiple shelves to correspond a shelf to a bay of the inlet elevator, each shelf configured to support a piece received from the inlet elevator, the mandrel configured to rotate each piece on a shelf between a loading position, a baking position, and an unloading position; an outlet elevator having multiple receiving bays for unloading a piece heated in the oven, the unloading bays are stacked vertically and the elevator is configured to move up or down to align an unloading bay with a material handling system moving the heated pieces; and an electroheat generator configured to heat at least one of the pieces when the pieces are in the baking position.

In accordance with one embodiment of the present invention a method for heating a material is provided. In some embodiments of the invention, the method for heating material includes a) loading material into an incoming holding area and then onto a mandrel in a vertically stacked manner; b) heating material with electroheat technology in a heating portion of an oven; and c) removing material from the mandrel to an unloading holding area and unloading the material from the unloading holding area; and d) rotating material on the mandrel from an area adjacent to the incoming holding area to the heating area and from the heating area to an area adjacent to the unloading holding area, wherein steps a)-c) are done substantially simultaneously.

In accordance with one embodiment of the present invention an oven is provided. In some embodiments of the invention, the oven includes: loading means for receiving material and vertically stacking it and delivering the stacked material to an adjacent component in a stacked manner; means for moving the stacked material to a heating portion of the oven; unloading means for receiving the stacked material from the means for moving and delivering the material in non-stacked single file line; and means for heating the stacked material when it is in the heating portion of the oven.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION

Figure 2:
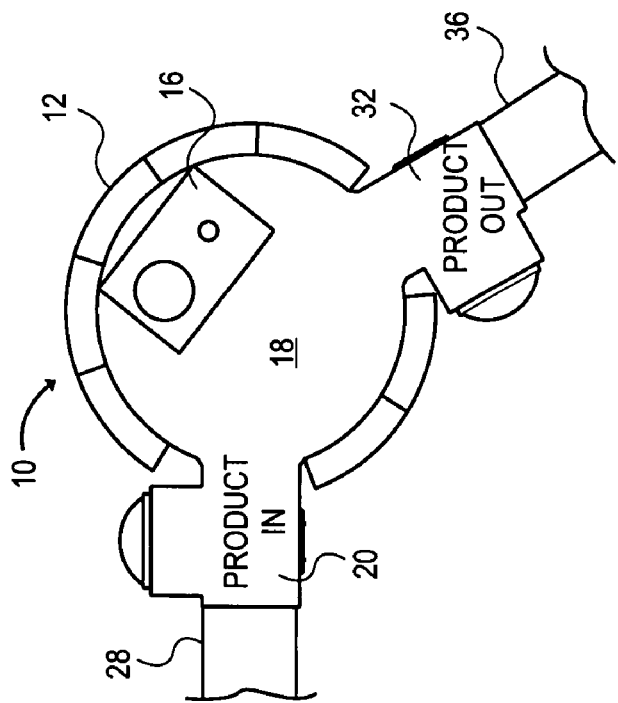
FIG. 2 is a top view of the oven shown in FIG. 1.

The invention will now be described with reference to the drawing figures, in which like references will mostly refer to like parts throughout. An embodiment in accordance with the present invention provides an oven integrated with a material handling system wherein the oven can receive material on a substantially continuous feed basis, provide heating to the material in order to cure it and offload the material from the oven in a substantially continuous manner.

Figure 1:
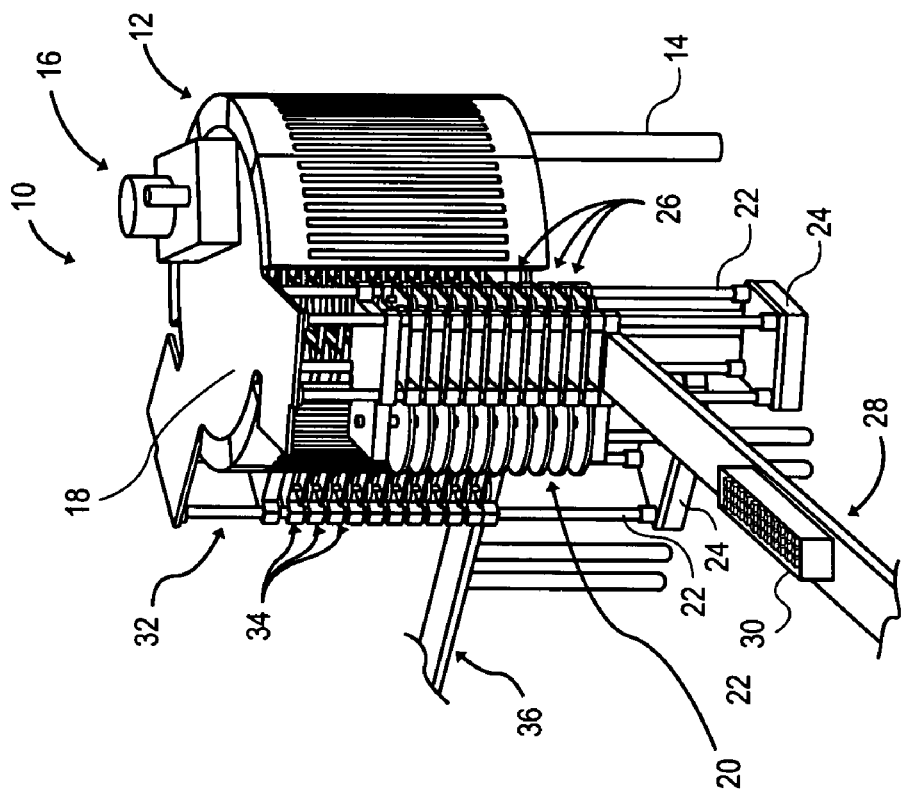
FIG. 1 is a perspective view of an oven in accordance with the present invention.

An embodiment of the present invention apparatus is illustrated in FIG. 1. An indexing oven 10 is illustrated in a perspective view. The indexing oven 10 includes a somewhat cylindrical portion 12. The oven 10 is supported by legs 14. While only one leg 14 is illustrated in FIG. 1, other legs are present, but are not shown in the illustrated view. Some embodiments of the invention may further include other leg configurations. One skilled in the art can make a determination of how many legs 14 will be used to support an oven.

On top of the oven 10 is an electroheat generator 16, which is supported or mounted on a top plate 18. In some embodiments of the invention the electroheat generator 16 is a microwave generator 16 as shown. In other embodiments of the invention, an electroheat generator can be an ebeam generator and configured to heat items in the oven. In some embodiments ebeam and microwaves can both be used.

Included on the oven 10 illustrated in FIG. 1 is an inletting elevator 20. The inletting elevator 20 has support columns 22, which are, in turn, supported by a support block 24. The inletting elevator 20 includes multiple inletting bays 26 stacked on top of each other as shown in FIG. 1. The array of inletting bays 26 are configured to travel up and down along the support columns 22. They travel in a substantially linear direction along the support columns 22 thus giving rise to the name elevator.

One skilled in the art can appreciate and select wherever components are necessary to cause the inletting elevator 20 to rise up and down and be controlled in order to stop at a desired point. While not illustrated in the figures, actuators and drive systems, along with sensors, are included as part of the elevator 20, in some embodiments of the invention. The inletting elevator 20 may be controlled in any suitable manner and may be controlled by a controller, for example. It may be a microcontroller or any other suitable type of controller.

An inletting material handling system 28 is connected to the inletting elevator 20. The inletting material handling system 28 is generally not considered part of the oven 10, but rather the oven 10 is connected to a material handling system 28 at the appropriate place in order to provide heat for curing the products being handled. In some embodiments of the invention, the material to be heated is microchips.

The material handling system 28 is illustrated primarily as a representation of the material handling system as not to be construed as shown to be limited to the configuration system. The material handling system 20 may provide in a somewhat continuous or regular manner product to be cured in the oven. The product may include pieces to be heated with or without a container. The container, when one is used, may be, but not necessarily be, considered part of the piece to be heated. The material handling system 28 may include a conveyor or similar continuous feed device.

The product may be delivered in a container such as in boats 30 containing the product to be cured. In accordance with the invention, the product to be heated may be microchips. The boats 30 containing the material move along the material handling system 28 until they enter one of the inletting bays 26 in the inletting elevator 20. In some embodiments of the invention, the material handling system 28 may cause the boats 30 to enter the inletting bays 26. In other embodiments of the invention, the oven 10 may include an apparatus or mechanism, which causes the boats 30 to be loaded from the material handling system 28 into the inletting bay 26.

The inletting elevator 28 moves up and down as necessary in order for a vacant inletting bay 26 to be presented to the material handling system 28 in order for a boat 30 to be loaded into the inletting bay 26. Once an inletting bay 26 has been loaded with a boat 30, the inletting elevator 26 moves up or down to then present another inletting bay 26. When all of the inletting bays 26 have been loaded with their boat 30, the boats 30 will be moved from the inletting elevator 20, which will be explained in more detail below with respect to FIGS. 3-5.

In some embodiments of the invention, in initial position will be when all of the inletting bays 26 are empty and the inletting elevator 20 is an up most position along the support columns 22. Then the material handling system 28 will present a boat 30 to the lower most inletting bay 26 on the inletting elevator 20. Then the inletting elevator 20 is lowered slightly to allow the very next inletting bay 26 be filled by a boat 30 and so on until all of the inletting bays 26 have been filled. When all of the inletting bay 26 are loaded the inletting elevator 20 rises again to its uppermost position for the boats 30 to be loaded into the cylindrical part 12 of the oven 10 as described in more detail below with respect to FIGS. 3-5.

In other embodiments of the invention, the material handling system 28 can be configured to initially load a boat 30 into any of the inletting bays 26 as long as the inletting elevator 20 is able to rise or fall in order to allow all of the inletting bays 26 to be filled. In some embodiments of the invention, the oven 10 will be equipped with 10 inloading bays; however, in other embodiments of the invention, any other number of inletting bays may be selected.

Shown in FIG. 1 is an outletting elevator 32 having multiple outletting bays 34. The outletting elevator 32 rides up and down support columns 22. The outletting elevator 32 is connected to an outletting material handling system 36. After the boats 30 have been processed within the oven 10, they are loaded into the outletting elevator 32 as will be discussed in more detail below with respect to FIGS. 3-5.

When all of the outletting bays 34 have been loaded with a boat 30 of heated or cured products then an outletting bay 34 will have its boat 30 unloaded onto the material handling system 36. The outletting elevator 34 will then move up or down in order to present another outletting bay 34 containing a boat 30 to be outletted.

In some embodiments of the invention, the inletting elevator 20 can also be the outletting elevator 32. An oven in accordance with the invention may have only one elevator which can function and an inletting and outletting elevator depending on whether it is inletting or outletting product. Likewise the material handling system can present and remove pieces (things to be heated in the oven) to and from such an oven. Such a single elevator oven may be desired due to its inherent lower cost and smaller footprint. One skilled in the art after reviewing this disclosure can make appropriate design choices to configure and control such an oven and material handling system to achieve a desired result.

In some embodiments of the invention, appropriate actuators and mechanisms will be included within the oven 10 in order to permit the boats 30 to be offloaded from the outletting bay 34 in the outletting elevator 32 onto the outletting material handling system 36. In some embodiments of the invention, the offloading apparatus may include a push rod and cylinder that can be actuated pneumatically, electrically, hydraulically or any other suitable manner. After reviewing the information continued herein, one skilled in the art will be able to select components desired for a particular installation of an oven 10 in order to have those components perform the function of offloading the boats 30 onto the outletting material handling system 36.

FIG. 2 is a top view of the oven 10 shown in FIG. 1. A cylindrical part of the oven 12 and the inletting and outletting elevators 20 and 32 are covered by the top plate 18. Mounted on top of the top plate 18 is a microwave generating apparatus 16. The material handling systems 28 and 36 are also illustrated.

Figure 3:
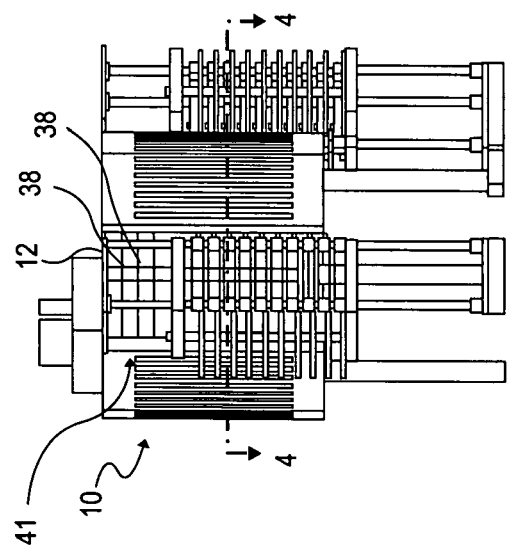
FIG. 3 is a side view of the oven of FIG. 1.

FIG. 3 is a side view of the oven 10 and also illustrates shelves 38 located within the cylindrical part 12 of the oven 10. The broken line located in FIG. 3 labeled 4-4 illustrates the line along which the section is taken and illustrated in FIG. 4.

Figure 4:
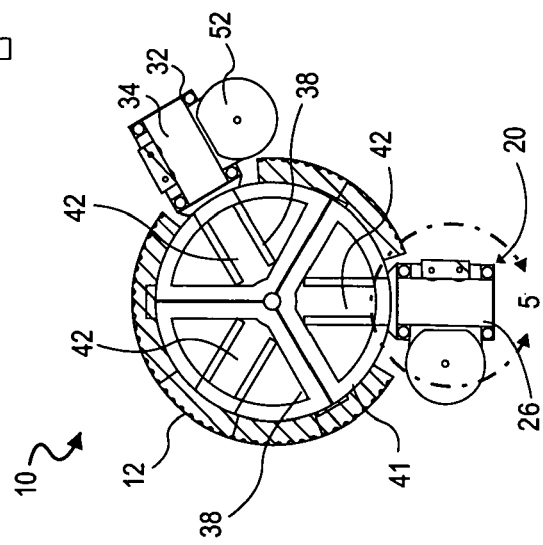
FIG. 4 is a cross-section view of FIG. 3 taken along the line 4-4 of FIG. 3.

FIG. 4 shows the cylindrical part 12 located within the oven 10. The inletting elevator 20 and outletting elevator 32 with their respective bays 26 and 34 are also shown. Within the cylindrical part 12 of the oven 10 are the shelves 38. Because FIG. 4 illustrates a horizontal cross-section of the oven, only one shelf 38 is visible in FIG. 4. However, referring back to FIG. 3, several shelves 38 are present in the illustrated embodiment. In fact, in some embodiments of the invention, there are 10 shelves. Other embodiments may have other numbers of shelves 38. The shelves 38 are rotatable and rotate as a unit, the unit being referred to as a mandrill 41. The shelves 38 may be connected together to form the mandrill 41.

In embodiments illustrated in FIG. 4, each shelf 38 contains three boat trays 42. A boat tray 42 is a portion of the shelf 38 configured to receive a boat 30. The boat trays 42 are aligned at approximately 120° from each other as shown in FIG. 4. When the mandrill 41 is stopped, one of the boat trays 42 is aligned to the inletting bay 26 and another boat tray 42 is aligned to the outletting bay 34. The third boat tray 42, which is not aligned to either the inletting elevator 20 or the outletting elevator 32 is in a baking position where it receives heat via microwaves from the microwave generator 16. In some embodiments of the invention, the elements in the boats 30 will also receive heat via conventional methods of heating (i.e. convention, conduction and radiant heating). Thus, ovens in accordance with the invention may use primarily convection, primarily microwave or a combination of convection and microwave heating.

Figure 5:
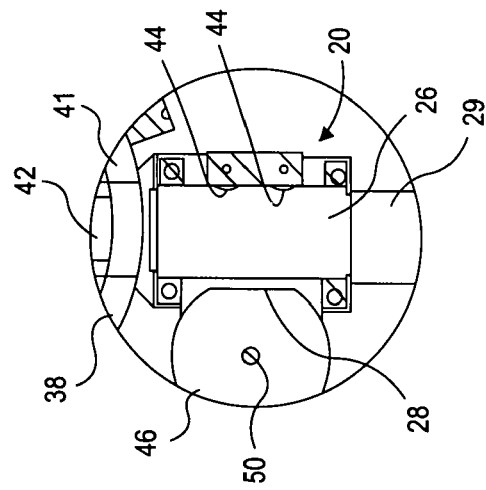
FIG. 5 is a detailed view of the detail indicated by a broken line circle labeled 5 of FIG. 4.

FIG. 5 is an enlarged, detailed view of the portion of FIG. 4 shown with the circular dotted line labeled 5 encompassing part of the apparatus.

FIG. 5 shows one of the many inletting bays 26 of the inletting elevator 20. The mandrill 41 is aligned so that the boat tray 42 of the shelf 38 is aligned with the inletting bay 26. The inletting material handling system 28 is also shown aligned with the inletting bay 26. Adjacent to the inletting bay 26 is an interrupted drum 46. The interrupted drum 46 is a generally circular member having a flat spot 48. The interrupted drum 46, when actuated, rotates about a pivot point 50 in order to load a boat 30 (shown in FIG. 1) from the inletting bay 26 to the boat tray 42.

In accordance with some embodiments of the invention, the material handling system 28 will load a boat 30 into the inletting bay 26. The flat spot 48 of the interrupted drum 46 is aligned to be parallel with one of the sides of the boat 30 when the boat 30 is loaded into the inletting bay 26. When a boat 30 has been loaded into the inletting bay 26, the interrupted drum 46 as shown in FIG. 5 will rotate counterclockwise. The interrupted drum 46 will engage the boat 30 and, as the interrupted drum 46 continues to rotate, will load the boat 30 onto the boat tray 42 of the shelf 38.

Gliders 44 are mounted to a side of the inletting bay 26 in order to provide an opposing surface for the boat 30 to urge against, when the interrupted drum 46 rotates and moves the boat 30 from the inletting bay 26 to the boat tray 42. The gliders 44 provide a bumper surface and a relatively low friction surface to allow relative ease of moving the boat 30 from the inletting bay 26 to the boat tray 42.

It is anticipated that in some embodiments of the invention, the material handling system 28 will deliver boats 30 in a somewhat continuous manner to the inletting elevator 20. The inletting elevator 20 will ride up and down on a support columns 22 in order to present an empty inletting bay 26 to the material handling system 28 until all of the inletting bays 26 contain a boat 30.

In some embodiments of the invention, the inletting elevator 20 when loaded with boats 30 will raise up to a fully-raised position where all of the inletting bays 26 line up with boat trays 42 located on the various shelves 38 of the mandrill 41. Then, simultaneously, or nearly simultaneously, the interrupted drums 46 rotate and offload all of the boats 30 onto the boat trays 42 of the shelves 38. Then, the elevator 20 returns to its sequence of loading the inletting bays 26.

Once the boats 30 have been loaded on to the mandrill 41, the mandrill 41 will rotate approximately 120°. In other embodiments of the invention where more than three boat trays 42 located on the shelves 38, the shelves 38 will rotate some other amount. How far the mandrill 41 will rotate will be related to how many boat trays 42 are located on the shelf 38. In embodiments of the invention where there are more than 3 boat trays 42 there may be more than one heating position or another position besides a loading, heating, and unloading position. In embodiments of the invention where there are only two boat trays 42 and one elevator, the mandril 41 will rotate between a heating position and a loading/unloading position.

At the end of the heating cycle, the mandrill 41 will rotate again so that one of the boat trays 42 will then be aligned with the outletting elevator 32 and one of the other boat trays 42 will be aligned with an outletting bay 34. The boats 30 will then be offloaded from the boat trays 42 into the outletting bays 34. In some embodiments of the invention, this can be done so that all of the outletting bays 34 are provided with a boat 30 at substantially the same time.

Once the boats 30 are located in the outletting bays 34, a second interrupted drum 52, as shown in FIG. 4, will offload the boat 30 from the outletting bay 34 to the outletting material handling system 36. Once all of the boats 30 have been offloaded from the boat tray 42, the mandrill 41 can rotate again to have the unloaded boat trays 42 align with the inletting bays 26.

In some embodiments of the invention, each of the three boat trays 42 can be in operation at once. In other words, one boat tray 42 can be offloaded while another boat tray 42 is being heated while a third boat tray 42 is being offloaded.

In some embodiments of the invention, a controller is programmed to have a cycle time providing the same amount of time for loading, heating and unloading. For example, the loading of the inletting elevator 20 may take approximately five minutes. During those five minutes, the mandrill 41 is at rest with a boat tray 42 aligned with the inletting bays 26 and a second boat tray 42 aligned with the outletting trays 44, while a third boat tray 42 is in the heating position having the products contained within the boats being heated and cured.

At the end of the exemplary 5 minute time interval, the mandrill 41 rotates approximately 120° to a position where one of the boat trays 42 on the shelf 38 is aligned with the elevator 20 and another boat tray 42 is aligned with the elevator 34. In some embodiments of the invention, the mandrill 41 will rotate about 120° approximately once every five minutes. Thus, over a 15 minute interval, the mandrill 41 will rotate an entire rotation and one load of boats 30 will be cycled through the oven 30.

Although, an example of the device is shown using an oven, it will be appreciated that other devices can be used in accordance with the invention. In fact, principles in accordance with the invention can be applied to any device where a single operation needs to be performed on parts being sent through a substantially continuous material handling system.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. An oven comprising:
   an inlet elevator having multiple receiving bays for receiving a piece to be heated in the oven where the receiving bays are stacked vertically and the elevator is configured to move up or down to align a receiving bay;
   a mandrel having multiple shelves to correspond a shelf to a bay of the inlet elevator, each shelf configured to support a piece received from the inlet elevator, the mandrel configured to rotate each piece on a shelf between a loading position, a baking position, and an unloading position;
   an outlet elevator having multiple receiving bays for unloading a piece heated in the oven, the unloading bays are stacked vertically and the elevator is configured to move up or down to align an unloading bay with a material handling system moving the heated pieces; and
   an electroheat generator configured to heat at least one of the pieces when the pieces are in the baking position.

2. The oven of claim 1, wherein the inlet elevator and the outlet elevator are the same elevator but it is an inlet elevator when it is receiving pieces from a material handling system and loading them onto the shelves and the elevator is an outlet elevator when it is unloading heated pieces to a material handling system.

3. The oven of claim 1, wherein the mandrel rotates approximately 120° when moving from the loading position to the baking position and another 120° in the same rotational direction when moving from the baking position to the unloading position.

4. The oven of claim 3, wherein each shelf is configured to support three pieces at once, one in the loading position, one in the baking position and one in the unloading position.

5. The oven of claim 4, wherein the mandrel is configured to rotate a piece from one position to another position about every 5 minutes.

6. The oven of claim 1, wherein the inlet elevator is configured to load the pieces substantially simultaneously from the receiving bays to the shelves.

7. The oven of claim 1, wherein the mandrel is configured to rotate to achieve more than one baking position.

8. The oven of claim 1, wherein the mandrel has 10 shelves.

9. The oven of claim 1, further comprising a programmable controller configured to control the movement of the mandrel and inlet and outlet elevators.

10. The oven of claim 9, further comprising sensors operatively connected to the controller for sensing a location of a piece.

11. The oven of claim 1, wherein the inlet and outlet elevators further comprise an interrupted drum configured to move a piece out of a bay when the drum rotates.

12. The oven of claim 1, further comprising a heating unit for subjecting the pieces to convection heat.

* * * * *